United States Patent

Seyfert et al.

[11] Patent Number: 5,955,829
[45] Date of Patent: Sep. 21, 1999

[54] CATHODE FOR ELECTRON GUN WITH BAND-SHAPED BEAMS

[75] Inventors: Ulf Seyfert; Olaf Röder; Siegfried Schiller; Siegfried Panzer; Robert Mohs, all of Dresden, Germany

[73] Assignee: Fraunhofer-Gesellschaft Zur Forderung Der Angewandten Forschung E.V., Munich, Germany

[21] Appl. No.: 08/934,678

[22] Filed: Sep. 22, 1997

[30] Foreign Application Priority Data

Sep. 23, 1996 [DE] Germany ............... 196 38 925

[51] Int. Cl.⁶ ............................................. H01J 1/46
[52] U.S. Cl. ........................ 313/411; 313/454; 315/13.1
[58] Field of Search ..................... 313/453, 454, 313/455, 411; 315/13.1; 250/492.1, 492.24, 423

[56] References Cited

U.S. PATENT DOCUMENTS

| | | |
|---|---|---|
| 2,659,023 | 11/1953 | Agule . |
| 3,831,052 | 8/1974 | Knechtli ............................ 313/187 |
| 3,863,163 | 1/1975 | Farrell et al. . |
| 3,925,670 | 12/1975 | Farrell et al. ..................... 250/400 |
| 4,095,115 | 6/1978 | Orr, Jr. et al. .................... 250/492.1 |
| 4,163,172 | 7/1979 | Loda ................................. 313/302 |
| 4,359,660 | 11/1982 | Smith et al. ..................... 378/119 |
| 4,499,405 | 2/1985 | Loda . |
| 5,019,744 | 5/1991 | Lee . |

FOREIGN PATENT DOCUMENTS

| | | |
|---|---|---|
| 0895344 | 11/1953 | Germany . |
| 4432983 | 10/1995 | Germany . |

*Primary Examiner*—Vip Patel
*Assistant Examiner*—Matthew J. Gerike
*Attorney, Agent, or Firm*—Greenblum & Bernstein P.L.C.

[57] ABSTRACT

Electron gun with band-shaped beams that includes a vacuum chamber extending in a longitudinal direction, a beam window running in the longitudinal direction along the vacuum chamber, and a cathode control-electrode system positioned within the vacuum chamber in the longitudinal direction. The cathode control-electrode system includes at least one substantially straight cathode positioned substantially parallel to a longitudinal axis of the cathode control-electrode system and the at least one substantially straight cathode has bulges formed at defined distances. The bulges are shaped to produce a substantially homogeneous current density distribution along the at least one substantially straight cathode and support units are located in the cathode control-electrode system to correspond with the bulges. The bulges are removably couplable to the support units.

16 Claims, 3 Drawing Sheets

CATHODE FOR ELECTRON GUN WITH BAND-SHAPED BEAMS

CROSS-REFERENCE TO RELATED APPLICATION

The present application claims priority under 35 U.S.C. § 119 of German Patent Application No. 196 38 925.9, filed Sep. 23, 1996, the disclosure of which is expressly incorporated by reference herein in its entirety.

BACKGROUND OF THE INVENTION

1. Field of the Invention

The present invention relates to an electron gun with band-shaped beams for producing an electron beam with a band-shaped cross-section. It is equipped with a linear cathode and is particularly suitable for low-energy electron beam systems. The electron beam exits into the atmosphere from a beam window, also called Lenard window. Preferred applications are the curing and cross-linkage of thin polymer coatings with a coating thickness of up to several 10 μm on band- as well as slab-shaped coating substrates.

2. Discussion of Background Information

Electron beam devices are known, wherein short, wire-shaped cathodes that are stressed in the running direction of the product are arranged in its electron gun. These cathodes are arranged equidistant and parallel to one another at certain distances and individually suspended under tension by springs. Their number is determined by the respective beam widths and therefore the window length. The cathode length is derived from the window width. Each of these cathodes is concentrically surrounded by a cylindrical grid. In addition another broad grid which stretches over all the grid-cathode arrangements is generally provided. The grids have been assigned different potentials and serve to homogenize the current density laterally to the cathode voltage direction (U.S. Pat. No. 3,863,163).

Since all of these cathodes are wired electrically in parallel, the disadvantage is that very high heating currents can arise—especially with large exposure widths and a correspondingly large number of parallel cathodes. Such cathode systems are used in particular for electron beam systems with acceleration voltages in the range of >180 kV. The width of the beam window is thereby in the range of 200 mm. Another disadvantage of such electron beam systems is that if an outage of single cathodes occurs, the homogeneity of the current density in the window length is significantly disturbed. The change of a cathode is very costly and time-consuming due to the construction.

Electron beam generators with a band-shaped beam cross-section whose beam window corresponds in length to the product width (DE 44 32 983 C1) are known. They have one or more parallel cathodes arranged over the window length and therefore the exposure width. A spring prestressing of the cathodes is necessary in order to limit the cathode sag. This cathode arrangement is surrounded by a generally tube-shaped control electrode, slitted in the beam direction, which serves to form the beam and if necessary to control the beam current.

All the devices have the disadvantage that with increasing window length, and thus also cathode length, a voltage strength is necessary which exceeds the yielding point of the cathode material at operating temperature. The result thereof is that with increased operating time the cathode length increases and the planned constructional oscillation path is reached. A cathode tear or an inadmissibly cathode sag leads to a critical limitation of the cathode's lifespan. The stretching of the cathode material thus limits the applicability of such cathode Systems based on cathode lengths, and therefore beam widths, of about one meter.

In addition, these cathode systems tend to undergo mechanical oscillations. Such oscillations can easily be instigated by external influences. The result of such cathode oscillations can be uncontrollable effects upon the beam formation and thus the homogeneity of the electron beam. The problems resulting from the oscillations also increase with the length of the voltage cathode system.

To limit the disadvantages connected with the voltage cathode system, one or more intermittent suspension devices of the cathode have been suggested. These solutions are of only limited use, since the heating of the cathodes is connected with a considerable change in length and the suspension must tolerate this change in length. To this is added an emission intrusion of the cathode at the place of suspension due to heat dissipation. A further disadvantage is that the suspension device itself has a local effect on the potential distribution near the cathodes, which can also have a negative impact on the homogeneity of the beam current density distribution.

SUMMARY OF THE INVENTION

The task of the invention is therefore to create an electron gun with band-shaped beams whose beam generation system can be realized for any exposure width. The cathode arrangement should be free of the disadvantages of prior art, in particular should not require prestressing units for the cathodes, and should enable a simple changing of the cathodes and a space-saving construction. The electron beam should be produced sufficiently homogeneous in the linear direction.

The solution in accordance with the invention essentially comprises the known arrangement of at least one wire-shaped cathode in the longitudinal direction of the beam window being constructed such that support units are positioned at certain distances. At the same distance in the wire-shaped cathode bulges are provided, in which the cathodes are secured. The voltage units which were previously used to prevent the cathodes from bending are made superfluous by this simple arrangement.

The distance between adjacent support units is selected such that the thermally-induced cathode sag between the support units remains in a range in which the effects on the beam shape are tolerably small. This range is primarily determined by the geometry of the cathode control-electrode system which determines the potential field. The position and distance of the support units to one other are also dependent upon the number of cathodes in use.

It is practical when using a number of cathodes—or at least two lying parallel to one another—to arrange the support units in a staggered fashion. This avoids a disadvantageous overlap of slight inhomogeneities in the beam current density, which can not be completely avoided. The heating of the cathodes in the direct current passage results in a potential gradient along the cathodes, which can have an effect on the beam shape. It is therefore practical to use an even number of cathodes and to wire the cathodes alternately electrically in antiparallel.

The essential characteristic of the solution in accordance with the invention is the bulges in the wire-shaped cathodes in the area of the support units. The heat dissipation at the support units leads to a temperature gradient along the cathode in the immediate vicinity of the mounting location.

A wide elimination of emission intrusions resulting thereof is achieved by a special shaping of the cathode in the area of the support unit, which leads to cathode areas with little or no emissions being located outside of the actual emission surface.

A further advantage to the spacial separation of the cathode suspension device and emission surface includes the fact that disturbances to the potential field in front of the cathode, caused by the bulges effecting the homogeneity of the beam current density, are almost completely avoided.

The bulges in the wire-shaped cathode thereby lead to segmentation, whereby the segments lying in the same emission temperature range lie close to each other and in a line, between the bulges at a small distance from each other.

It is furthermore preferable to select a distance of the bulges to the support unit for the cold cathode, such that it is reduced by approximately the amount of the thermal expansion. The result thereby is a slight mechanical pre-stressing of the cathode when securing the cold cathode in the support unit. This results in a significant compensation of the thermal expansion occurring while heating the cathode by the contraction of the bulges due to the elasticity in the "cold" area of the bulge, thereby resulting in a reduction of cathode sag.

To homogenize the beam density distribution, it is practical to position a grid in the beam direction in front of the cathode level. If the grid is on a more positive potential (<1 kV) than the cathode, a pre-acceleration of the electrons and a fanning out of the electron beam is achieved. Due to the shape of this pre-acceleration grid (convex, concave or flat) and the geometric configuration of the beam exit area in the cathode control-electrode system, the resulting beam width is tailored to the requirements.

A further homogenization of the beam current density can be achieved by a second, more transparent grid than the first, which is positioned in the beam direction after the first grid. This second grid is at approximately cathode potential.

Accordingly, the present invention is directed to an electron gun with band-shaped beams. The electron gun includes a vacuum chamber extending in a longitudinal direction, a beam window running in the longitudinal direction along the vacuum chamber, and a cathode control-electrode system positioned within the vacuum chamber in the longitudinal direction. The cathode controlelectrode system includes at least one substantially straight cathode positioned substantially parallel to a longitudinal axis of the cathode control-electrode system and the at least one substantially straight cathode has bulges formed at defined distances. The bulges are shaped to produce a substantially homogeneous current density distribution along the at least one substantially straight cathode and support units are located in the cathode control-electrode system to correspond with the bulges. The bulges are removably couplable to the support units.

In accordance with another feature of the present invention, the support units are equidistantly located in the cathode control-electrode system.

In accordance with another feature of the present invention, the at least one substantially straight cathode includes a plurality of cathodes and the support units of adjacent cathodes are arranged offset from each other so that the plurality of cathodes discontinuously extend along the longitudinal direction of the beam window.

In accordance with still another feature of the present invention, a distance between the bulges in a cold cathode is less than a distance between the support units to compensate for an amount of thermal elongation.

In accordance with a further feature of the present invention, the at least one substantially straight cathode includes a plurality of cathodes having an even number and the plurality of cathodes are alternatingly electrically wired in antiparallel.

In accordance with still another feature of the present invention, a temperature in the bulge of the at least one substantially straight cathode is reduced in relation to the temperature in a substantially straight portion of the at least one substantially straight cathode. Further, vertices of the curvature of the at least one substantially straight cathode are positioned on an exterior of the bulge in a transition area between the substantially straight portion of the cathode and the bulge. Still further, the bulge is substantially in a shape of an omega.

In accordance with a further feature of the present invention, each of the support units are composed of a tube-shaped isolator having a bolt positioned to extend out of the isolator. The electron gun further includes a mounting unit positioned on the bolt and adapted to receive a corresponding bulge of the at least one substantially straight cathode.

In accordance with a still further feature of the present invention, the electron gun includes a grid positioned in front of the at least one substantially straight cathode in the beam direction and maintained at a more positive potential than the at least one substantially straight cathode. Further, the electron gun includes a reflector strip maintained at a cathode potential and positioned on a side of the at least one substantially straight cathode facing away from the direction of the beam. Further, the electron gun may include a second grid positioned after the grid in the beam direction and maintained approximately at a cathode potential.

In accordance with yet another feature of the present invention, the electron gun may be utilized for curing thin polymer coatings under atmospheric pressure. Alternatively, the electron gun may be used for cross-linking thin polymer coatings under atmospheric pressure.

The present invention is directed to a process of producing band-shaped beams from an electron gun. The electron gun includes a vacuum chamber extending in a longitudinal direction, a beam window running in the longitudinal direction along the vacuum chamber, and a cathode control-electrode system positioned within the vacuum chamber in the longitudinal direction that includes at least one substantially straight cathode that is positioned substantially parallel to a longitudinal axis of the cathode control-electrode system and that has bulges formed at defined distances and shaped to produce a substantially homogeneous current density distribution along the at least one substantially straight cathode. The electron gun also includes support units located in the cathode control-electrode system to correspond with the bulges, which are removably couplable to the support units. The process includes applying a cathode potential to the at least one substantially straight cathode, applying a grid potential that is more positive than the cathode potential to a grid positioned between the at least substantially straight cathode and the beam window, and applying the cathode potential to a reflector positioned on a side of the at least one substantially straight cathode opposite the beam window. In this manner, the substantially homogeneous current distribution is directed toward the beam window.

The present invention is directed to an electron gun with band-shaped beams. The electron gun includes a vacuum chamber extending in a longitudinal direction, a beam window running in the longitudinal direction along the vacuum chamber, and a cathode control-electrode system positioned within the vacuum chamber in the longitudinal direction. The cathode control-electrode system includes at least one substantially straight cathode positioned substantially parallel to a longitudinal axis of the cathode control-electrode system and the at least one substantially straight cathode has bulges formed at defined distances. The electron gun includes support units located in the cathode control-electrode system to correspond with the bulges. The bulges are removably couplable to the support units.

BRIEF DESCRIPTION OF THE DRAWING FIGURES

The present invention is further described in the detailed description which follows, in reference to the noted plurality of drawings by way of non-limiting examples of preferred embodiments of the present invention, in which like reference numerals represent similar parts throughout the several views of the drawings, and wherein:

FIG. 1 a cross-section of an electron gun with band-shaped beams;

FIG. 2 a support unit with suspended cathode; and

FIG. 3 a calculated course of the electron beam in the vicinity of the support unit with omega-shaped cathode bulge.

DETAILED DESCRIPTION OF THE INVENTION

The particulars shown herein are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for the fundamental understanding of the invention, the description taken with the drawings making apparent to those skilled in the art how the several forms of the invention may be embodied in practice.

Figure 1:
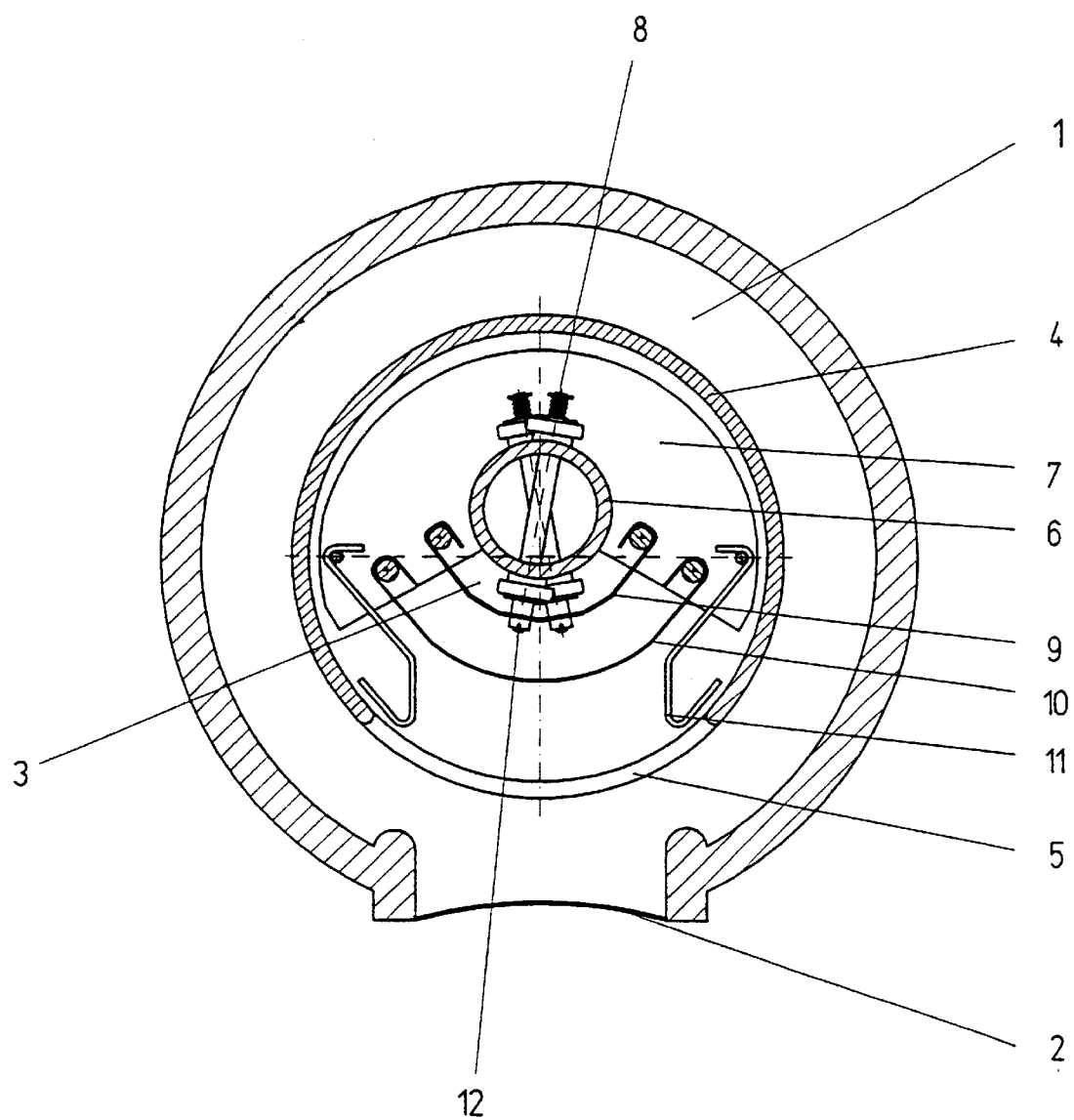

FIG. 1 shows an embodiment of the electron gun with band-shaped beams in accordance with the invention as it is used for curing finishes on slabs. The electron gun with band-shaped beams comprises a tube-shaped vacuum chamber 1 with a beam window 2. A cathode control-electrode system 3 is arranged axially concentric to the vacuum chamber 1. The cathode control-electrode system 3 comprises a tube 4 and cathode carrier inserted into this tube 4. The tube 4 has an opening 5 in the area near where the beam exits. The cathode carrier is comprised of the middle tube 6 and numerous support slabs 7, which are arranged behind one another. The middle tube 6 is segmented and, together with the support plates 7, comprises a modular entity which can be lengthened as desired at discrete distances. The middle tube 6 carries support units 8, serving to receive the cathode, at a distance from one another and is isolated from middle tube 6. A reflector strip 9, a grid 10 and beam-shaping strips 11 are attached concentrically to one another on support slabs 7 in such a way that all construction parts can slide relative to each other in the longitudinal direction due to thermal expansion. The reflector strip 9 assists in the formation of the potential field and at the same time reduces the heat radiation on the tube 4 and the support units 8. The grid 10 is positioned electrically isolated from the other parts of the cathode control-electrode system 3 and covers the entire area of the beam window 2.

The tube 4 is kept on a negative high-voltage potential together with the cathode carrier, the reflector strip 9 and the laterally-positioned beam-shaping strips 11. On the grid 10 there is a more positive voltage relative to the cathodes 12. Two wire-shaped cathodes 12 are arranged parallel to one another.

The support units 8 comprise isolators 13 which are inserted into bores of the middle tube 6, and a bolt 14 which carries a securing element 15 for the cathodes 12. The bores are arranged on the outer surface of the middle tube 6 so that both cathodes 12 are alternately suspended on the sequentially arranged support units 8. Each of the final support units 8 additionally serves the contacting of the cathodes 12.

Figure 2:
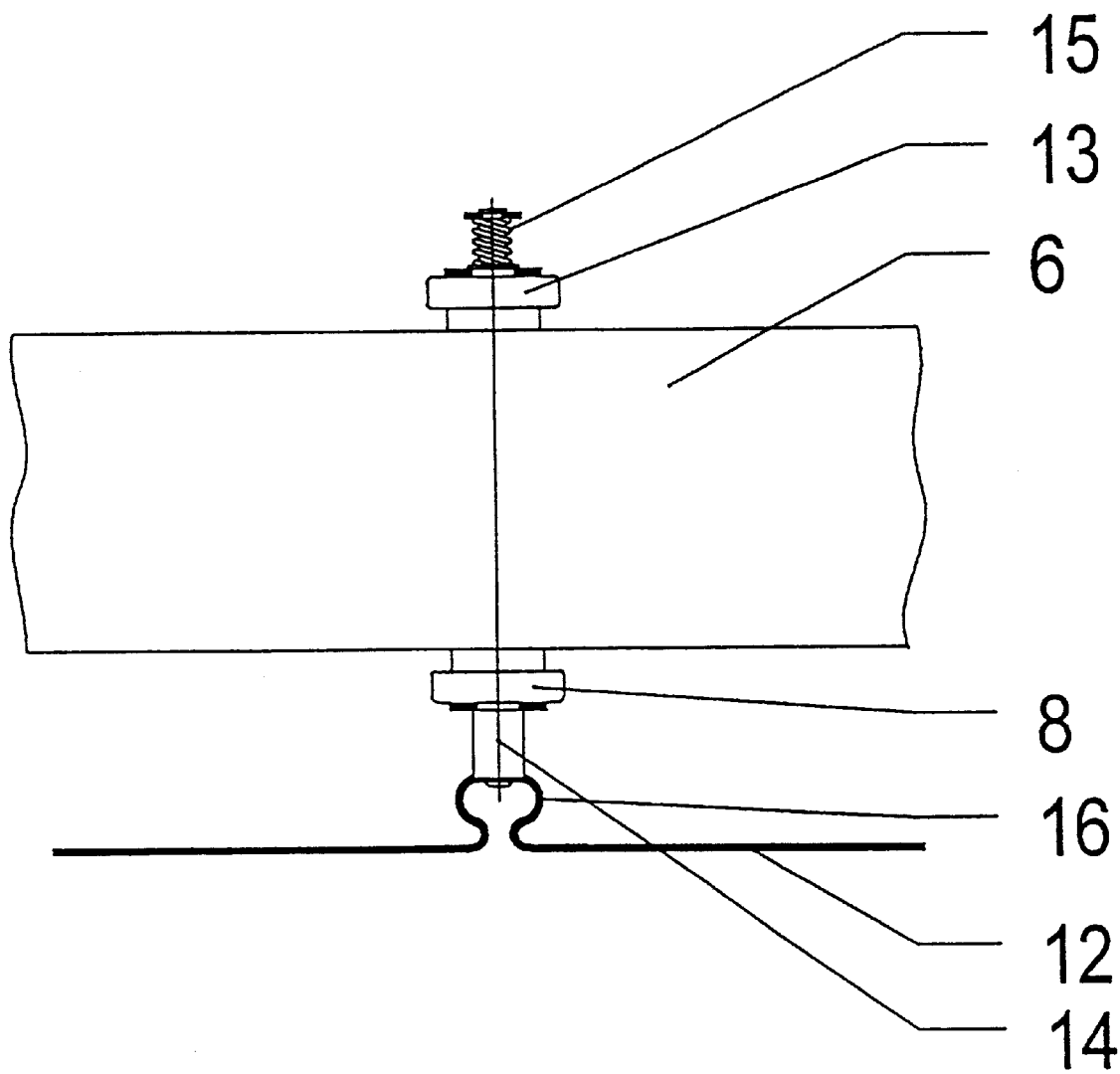

FIG. 2 shows an enlargement of a support unit 8 with an attached cathode 12.

The isolator 13 is imbedded into the middle tube 6. Within it, bolt 14 is positioned in a slidable manner. A pressure spring 15 on the bolt 14 results in a cathode 12, suspended in a slit of bolt 14, being held by known mounting units. Cathode 12, suspended in bolt 14, is held by the strength of pressure spring 15. The cathode 12 has at least one omega-shaped bulge 16 which, due to its spring loading, almost entirely prevents bending and produces a nearly homogeneous, linear electron beam. The distance between the bulges in a cold cathode is less than a distance between the support units so as to compensate for an amount of thermal elongation.

A cathode change can thus be executed very easily, since cathode 12 can be removed and re-attached with a light pressure on bolt 14.

Figure 3:
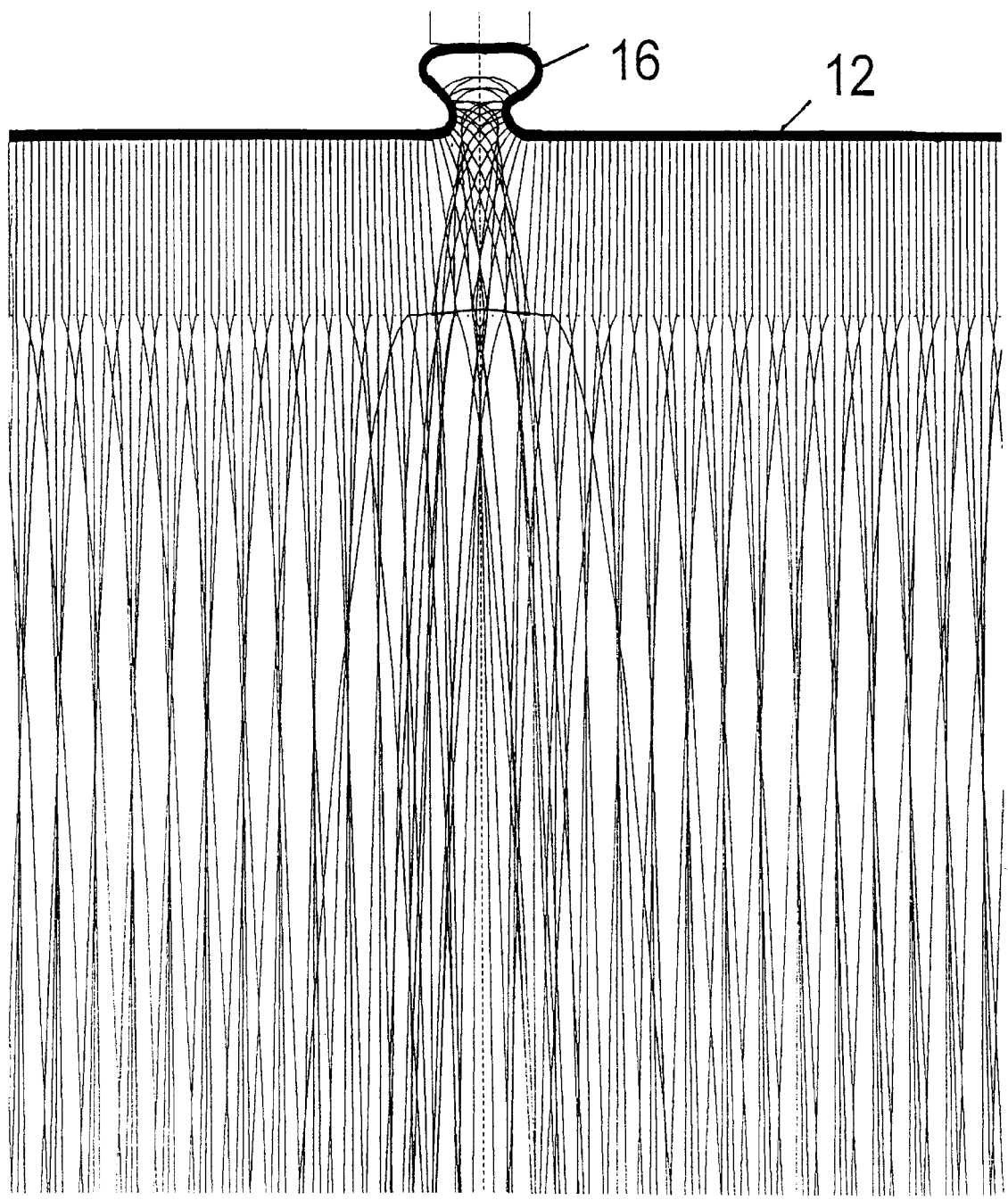

FIG. 3 shows in the drawing plane the course of the electron beam in the area of a support unit 8 with the omega-shaped bulge 16 of cathode 12. It is evident from it that the shape of bulge 16 allows the creation of a practically homogeneous, line-shaped electron beam.

It is noted that the foregoing examples have been provided merely for the purpose of explanation and are in no way to be construed as limiting of the present invention. While the invention has been described with reference to a preferred embodiment, it is understood that the words which have been used herein are words of description and illustration, rather than words of limitation. Changes may be made, within the purview of the appended claims, as presently stated and as amended, without departing from the scope and spirit of the invention in its aspects. Although the invention has been described herein with reference to particular means, materials and embodiments, the invention is not intended to be limited to the particulars disclosed herein; rather, the invention extends to all functionally equivalent structures, methods and uses, such as are within the scope of the appended claims.

What is claimed is:

1. An electron gun with band-shaped beams, comprising:
    a vacuum chamber extending in a longitudinal direction;
    a beam window running in the longitudinal direction along the vacuum chamber;
    a cathode control-electrode system positioned within the vacuum chamber in the longitudinal direction;
    the cathode control-electrode system including at least one substantially straight cathode positioned substantially parallel to a longitudinal axis of the cathode control-electrode system, the at least one substantially straight cathode having bulges formed at defined distances;
    the bulges being shaped to produce a substantially homogeneous current density distribution along the at least one substantially straight cathode; and support units located in the cathode control-electrode system to correspond with the bulges, the bulges being removably couplable to the support units.

2. The electron gun in accordance with claim 1, the support units being equidistantly located in the cathode control-electrode system.

3. The electron gun in accordance with claim 1, the at least one substantially straight cathode comprising a plurality of cathodes; and the support units of adjacent cathodes being arranged offset from each other so that the plurality of cathodes discontinuously extend along the longitudinal direction of the beam window.

4. The electron gun in accordance with claim 1, wherein a distance between the bulges in a cold cathode is less than a distance between the support units to compensate for an amount of thermal elongation.

5. The electron gun in accordance with claim 1, the at least one substantially straight cathode comprising a plurality of cathodes having an even number; and the plurality of cathodes being alternatingly electrically wired in antiparallel.

6. The electron gun in accordance with claim 1, wherein the bulge of the at least one substantially straight cathode exhibits a temperature that reduced in relation to the temperature in a substantially straight portion of the at least one substantially straight cathode.

7. The electron gun in accordance with claim 6, wherein a transition area between the substantially straight portion of the cathode and the bulge is curved such that a portion of an exterior of the bulge is positioned over an exterior of the substantially straight portion of the cathode.

8. The electron gun in accordance with claim 6, the bulge being substantially in a shape of an omega.

9. The electron gun accordance with claim 1, further comprising:

a grid positioned in front of the at least one substantially straight cathode in the beam direction; and the grid being maintained at a more positive potential than the at least one substantially straight cathode.

10. The electron gun in accordance with claim 1, the electron gun being adapted for curing thin polymer coatings in air.

11. The electron gun in accordance with claim 1, the electron gun being adapted for cross-linking thin polymer coatings in air.

12. An electron gun with band-shaped beams, comprising:

a vacuum chamber extending in a longitudinal direction;

a beam window running in the longitudinal direction along the vacuum chamber;

a cathode control-electrode system positioned within the vacuum chamber in the longitudinal direction;

the cathode control-electrode system including at least one substantially straight cathode positioned substantially parallel to a longitudinal axis of the cathode control-electrode system, the at least one substantially straight cathode having bulges formed at defined distances;

the bulges being shaped to produce a substantially homogeneous current density distribution along the at least one substantially straight cathode; and support units located in the cathode control-electrode system to correspond with the bulges, the bulges being removably couplable to the support units;

each of the support units being composed of a tube-shaped isolator having a bolt positioned to extend out of the isolator; and further comprising:

a mounting unit positioned on the bolt and adapted to receive a corresponding bulge of the at least one substantially straight cathode.

13. An electron gun with band-shaped beams, comprising:

a vacuum chamber extending in a longitudinal direction;

a beam window running in the longitudinal direction along the vacuum chamber;

a cathode control-electrode system positioned within the vacuum chamber in the longitudinal direction;

the cathode control-electrode system including at least one substantially straight cathode positioned substantially parallel to a longitudinal axis of the cathode control-electrode system, the at least one substantially straight cathode having bulges formed at defined distances;

the bulges being shaped to produce a substantially homogeneous current density distribution along the at least one substantially straight cathode;

support units located in the cathode control-electrode system to correspond with the bulges, the bulges being removably couplable to the support units;

a grid positioned in front of the at least one substantially straight cathode in the beam direction;

the grid being maintained at a more positive potential than the at least one substantially straight cathode;

a reflector strip maintained at a cathode potential; and the reflector strip being positioned on a side of the at least one substantially straight cathode facing away from the direction of the beam.

14. An electron gun with band-shaped beams, comprising:

a vacuum chamber extending in a longitudinal direction;

a beam window running in the longitudinal direction along the vacuum chamber;

a cathode control-electrode system positioned within the vacuum chamber in the longitudinal direction;

the cathode control-electrode system including at least one substantially straight cathode positioned substantially parallel to a longitudinal axis of the cathode control-electrode system, the at least one substantially straight cathode having bulges formed at defined distances;

the bulges being shaped to produce a substantially homogeneous current density distribution along the at least one substantially straight cathode;

support units located in the cathode control-electrode system to correspond with the bulges, the bulges being removably couplable to the support units;

a grid positioned in front of the at least one substantially straight cathode in the beam direction;

the grid being maintained at a more positive potential than the at least one substantially straight cathode;

a second grid positioned after the grid in the beam direction; and the second grid being maintained approximately at a cathode potential.

15. A process of producing band-shaped beams from an electron gun, the electron gun including a vacuum chamber extending in a longitudinal direction, a beam window running in the longitudinal direction along the vacuum chamber, a cathode control-electrode system positioned within the vacuum chamber in the longitudinal direction that includes at least one substantially straight cathode that is positioned substantially parallel to a longitudinal axis of the cathode control-electrode system and that has bulges formed at defined distances and shaped to produce a substantially homogeneous current density distribution along the at least one substantially straight cathode, and support units located in the cathode control-electrode system to correspond with the bulges, which are removably couplable to the support units, the process comprising:

applying a cathode potential to the at least one substantially straight cathode;

applying a grid potential that is more positive than the cathode potential to a grid positioned between the at least substantially straight cathode and the beam window; and applying the cathode potential to a reflector positioned on a side of the at least one substantially straight cathode opposite the beam window;

whereby the substantially homogeneous current distribution is directed toward the beam window.

16. An electron gun with band-shaped beams, comprising:

a vacuum chamber extending in a longitudinal direction;

a beam window running in the longitudinal direction along the vacuum chamber;

a cathode control-electrode system positioned within the vacuum chamber in the longitudinal direction;

the cathode control-electrode system including at least one substantially straight cathode positioned substantially parallel to a longitudinal axis of the cathode control-electrode system, the at least one substantially straight cathode having bulges formed at defined distances; and support units located in the cathode control-electrode system to correspond with the bulges, the bulges being removably couplable to the support units.

* * * * *